United States Patent [19]

Nyswander

[11] 4,051,439
[45] Sept. 27, 1977

[54] SHORT PULSE MAGNETRON TRANSMITTER

[75] Inventor: Reuben E. Nyswander, China Lake, Calif.

[73] Assignee: The United States of America as represented by the Secretary of the Navy, Washington, D.C.

[21] Appl. No.: 304,574

[22] Filed: Nov. 2, 1972

[51] Int. Cl.² .............................................. H04B 1/04
[52] U.S. Cl. ................................ 325/121; 328/67; 331/87
[58] Field of Search ........................ 328/65, 66, 67, 61, 328/63, 207; 332/14, 5, 12; 325/141, 121; 331/87

[56] References Cited

U.S. PATENT DOCUMENTS

| 2,946,958 | 7/1960 | Bonia et al. | 328/65 |
| 3,268,822 | 8/1966 | Hickey | 328/65 |
| 3,387,177 | 6/1968 | Israel et al. | 328/67 |
| 3,424,925 | 1/1969 | Gagliardi et al. | 328/67 |

*Primary Examiner*—Maynard R. Wilbur
*Assistant Examiner*—T. M. Blum
*Attorney, Agent, or Firm*—R. S. Sciascia; Roy Miller

[57] ABSTRACT

A magnetron transmitter having a two-stage modulator, one stage generating a long, slowly rising, low power pulse, and the other generating a short, high power pulse, whereby high resolution is obtainable without the use of pulse compression techniques.

6 Claims, 1 Drawing Figure

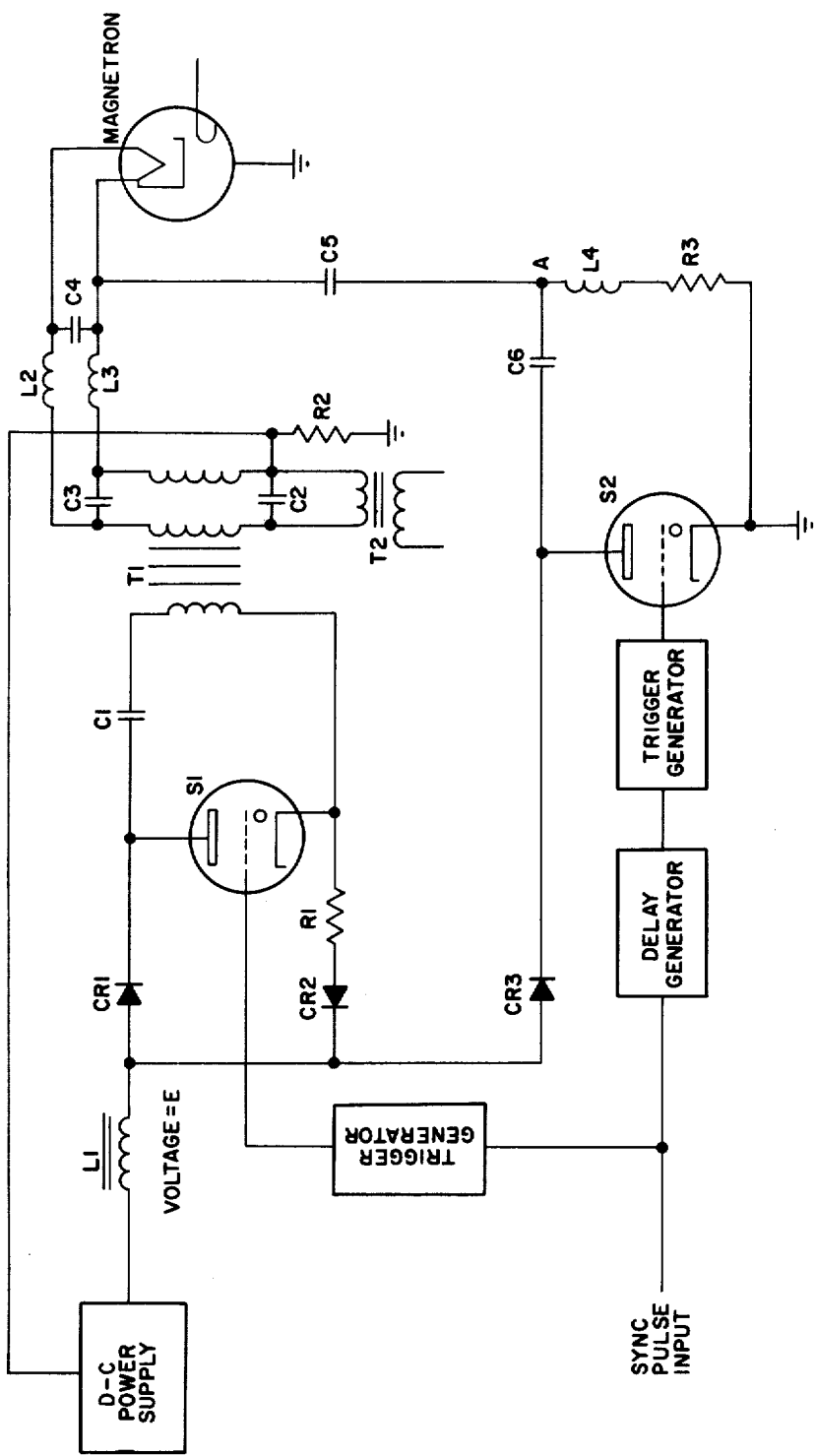

4,051,439

SHORT PULSE MAGNETRON TRANSMITTER

BACKGROUND OF THE INVENTION

The present invention relates to the field of electronic transmitters and more specifically to magnetron transmitters. Previously, magnetron transmitters have not been used for high resolution, short pulse radars because of their inherently slow starting characteristic.

In operation, the magnetron oscillates. To achieve proper initiation of oscillation the pulse applied to the magnetron by the modulator in the circuit must have a relatively slow rate of rise in the transition region, i.e., the region in which the magnetron begins to oscillate. If the applied pulse rises too rapidly in the critical region either of two types of misfire may occur. In the first type the tube may go into oscillation in the wrong mode, i.e., at the wrong frequency and at a higher voltage. In the second, the tube may not oscillate at all. Both of the above misfires may be accompanied by a high voltage arc-over inside the tube.

The requirement for a slowly rising modulator pulse is incompatible with the generation of a very short pulse. Using conventional techniques it has never been possible to operate a magnetron with pulses as short as 25 nanoseconds, and for this reason pulse compression systems have been primarily used to obtain high range resolution.

At present, most high resolution radar systems use pulse compression techniques. In that approach long pulses on the order of a microsecond of linearly swept radio frequency are generated using a voltage controlled oscillator. These pulses are amplified and transmitted. In some systems high range resolution is obtained by time-compressing the received signals in a frequency dispersive delay network.

Other systems (frequency domain pulse compression) use an array of band-pass filters to separate the signals from different ranges, and in one pulse period data are available only from narrow strips of the overall range. In both of these systems high range resolution is bought at the cost of complexity and considerable economic expense.

High range resolution could be obtained using a simple, conventional radar system if a short pulse, high power transmitter were available. None have been in the past. These requirements are met for the first time by the short pulse, magnetron transmitter of the present invention. Its advantages over the pulse compression systems are summarized below.

1. Simplicity. No frequency modulated r-f signal generator and accompaning waveform generators are needed. No power amplifiers are needed. The transmitted signal is generated in one device at the output power level. There are no images (as in the frequency domain, pulse compression system) and no image rejection schemes are necessary. No pulse compression network nor band-pass filters are needed.

2. Low Cost. The relative simplicity results in a considerable saving. Also, a magnetron is a low-cost device and is much cheaper than the traveling wave tube amplifiers used in the pulse comppression systems.

3. Performance. The radar using a short pulse magnetron transmitter should have performance equal to that of either type of pulse compression system. It will have an advantage over the frequency domain system in that data are available from all range increments in each pulse period rather than only from narrow strips.

4. Short Range Capability. A radar system is blindto targets at ranges less than $(\delta/2)$ feet, where $\delta$ is the pulse duration in nanoseconds. A short pulse system will be able to see targets at much closer ranges, e.g., 6 feet, than the pulse compression systems. The latter will be blind to targets closer than the order of 500 feet.

SUMMARY OF THE INVENTION

The present invention is a circuit including a magnetron in which the magnetron may be made to operate reliably with short pulses through the use of some special modulator techniques. A slowly rising pulse is applied to the magnetron causing it to go into oscillation at a very low power level. A short, fast rising pulse is then applied to the magnetron, driving it to full power level. At the time the short pulse is applied the magnetron is already oscillating normally in the proper mode and turn-on problems do not exist. Tests using this technique have demonstrated reliable magnetron operation using pulses as short as 11 nanoseconds.

BRIEF DESCRIPTION OF THE DRAWING

The FIGURE is a schematic diagram, partially in block form, of the preferred embodiment of the present invention.

DESCRIPTION OF THE PREFERRED EMBODIMENT

The drawing shows the preferred embodiment of the short pulse magnetron transmitter. The circuit, basically, consists of two DC resonance charging, line-type modulator stages, both of which are coupled to the magnetron. One modulator generates the long, slowly rising, low power pulse. The other generates the short, high power pulse.

The first modulator stage, i.e., the stage which generates the long, slowly rising, low power pulse, includes rectifiers $CR_1$ and $CR_2$; resistor $R_1$; long pulse storage capacitors $C_1$ and capacitors $C_2$, $C_3$, and $C_4$; inductors $L_2$ and $L_3$; step-up pulse transformer $T_1$ and magnetron filament supply transformer $T_2$; hydrogen thyratron switch $S_1$; and the trigger generator coupling the syncronizing pulse input to the grid of thyratron $S_1$.

The second modulator stage, i.e., the stage which generates the short, high power pulse, includes rectifier $CR_3$; short pulse storage capacitor $C_6$ and capacitor $C_5$; resistor $R_3$; inductor $L_4$; hydrogen thyratron switch $S_2$; and delay and trigger generators coupling the syncronizing pulse input to thyratron $S_2$.

The preferred embodiment of the present invention additionally includes a DC power supply providing a voltage output E and a resonance charging reactor $L_1$ for, in combination with the power supply, charging long pulse storage capacitor $C_1$ and short pulse storage capacitor $C_6$ to a voltage value 2E. The resultant charge on $C_1$ and $C_6$ can be considered an initial condition as far as the rest of the circuit is concerned. $C_1$ and $C_6$ replace the capacitive elements of the pulse forming networks or lines normally used in line-type modulators.

The long pulse is produced in the following manner. When $C_1$ and $C_6$ are fully charged an input synchronizing pulse occurs and a trigger pulse is applied to the grid of the hydrogen thyratron switch tube, $S_1$, which goes into conduction. $C_1$ discharges through $S_1$ and through the primary of pulse transformer $T_1$. The resulting pulse is stepped up in voltage by $T_1$ and applied to the magnetron through the inductances $L_2$ and $L_3$. $L_2$ and $L_3$ can be either separate inductances of equal value, or they can be wound as one coil with bi-filar windings. The duration and rate of rise of the long pulse are primarily determined by the value of $C_1$ and the value of $L_2$ and $L_3$ in parallel. The amplitude of the long pulse is made to be such that the magnetron goes into osciallation at a very low power level. The capacitor $C_5$ is analogous to the de-spiking capacitor sometimes used in line-type modulators to limit the rate of rise of the output pulse. $C_5$ charges up to the full voltage of the pulse being applied to the magnetron.

Capacitors $C_2$, $C_3$, $C_4$ are pulse by-pass capacitors. Their function is to ensure that no pulse voltage is developed across the bi-filar transformer windings nor across the magnetron filament. The magnetron filament power is supplied from transformer $T_2$.

Hydrogen thyratron switch $S_2$ is triggered with a certain amount of delay from the input pulse. This delay is such that $S_2$ does not conduct until after the magnetron has gone into oscillation. When $S_2$ conducts, the capacitor $C_6$ discharges through it to ground and a short, negative pulse is produced at point A (between $C_6$ and $L_4$). The short pulse is coupled through $C_5$ to the magnetron cathode. The amplitude is such that the magnetron is driven to full power for the duration of the short pulse. A portion of the short pulse current flows through $L_4$ and $R_3$. The remainder flows through the magnetron. The duration and shape of the short pulse are determined by the values of $C_6$, $L_4$, $R_3$, and $C_5$. The short pulse is isolated from the long pulse circuitry by the reactance of $L_2$ and $L_3$.

The ratio of long pulse amplitude to short pulse amplitude is determined primarily by the step-up of the pulse transformer $T_1$. This ratio is somewhat critical and will define what the step-up of $T_1$ must be.

The rectifiers $CR_1$ and $CR_3$ are charging diodes or hold-off diodes such as are normally used in DC resonance charging, line type modulators. $CR_2$ is a shunt or reverse current diode which is also normally used. The functioning of these diodes is familiar and need not be described here.

What is claimed is:

1. A short pulse magnetron transmitter, comprising:
   a control signal input;
   a long pulse generator coupled to said input for generating a long, low power level pulse in response to said control signal;
   a short pulse generator coupled to said input for generating a short, high power level pulse in response to said control signal, including means for delaying the generation of said short, high power level pulse;
   a magnetron coupled to said long pulse generator and said short pulse generator such that said magnetron is placed in oscillation by said long, low power level pulse and is driven to high power by said short, high power level pulse.

2. The transmitter of claim 2 wherein said long pulse generator includes a first thyratron switch and said short pulse generator includes a second thyratron switch.

3. The transmitter of claim 2 wherein said long pulse generator further includes a plurality of inductance means for isolating said long pulse generator from said short pulse generator.

4. The transmitter of claim 3 wherein said long pulse generator further includes a trigger generator for triggering said first thyratron switch in response to said control input, and said short pulse generator further includes a trigger generator for triggering said second thyratron switch in response to the output of said delaying means.

5. The transmitter of claim 4 wherein said delaying means is a delay generator coupled to said control unit and said second trigger generator is coupled to the output of said delay generator.

6. The transmitter of claim 5 further comprising a power supply circuit coupled to said first and said second thyratron switches, including a voltage supply, a first rectifier coupled between the voltage supply and the anode of said first thyratron switch, a second rectifier coupled between the voltage supply and the anode of said second thyratron switch, and a reverse current diode coupled between the voltage supply and the common ground of the transmitter.

* * * * *